United States Patent [19]
Duba et al.

[11] Patent Number: 6,075,684
[45] Date of Patent: Jun. 13, 2000

[54] METHOD AND ARRANGEMENT FOR DIRECT CURRENT CIRCUIT INTERRUPTION

[75] Inventors: Greg A. Duba, New London, Conn.; Edgar S. Thaxton, Bradford, R.I.; John Walter, Niantic, Conn.

[73] Assignee: Electric Boat Corporation, Groton, Conn.

[21] Appl. No.: 09/046,075

[22] Filed: Mar. 23, 1998

[51] Int. Cl.[7] .................................................. H02H 3/00
[52] U.S. Cl. .............................................................. 361/4
[58] Field of Search ................................. 361/3, 4, 5, 6, 361/8, 9, 10, 11, 13; 323/282

[56] References Cited

U.S. PATENT DOCUMENTS

| | | |
|---|---|---|
| Re. 27,557 | 1/1973 | Lian . |
| 1,281,826 | 10/1918 | Philippi . |
| 1,850,321 | 3/1932 | Greenwood . |
| 2,637,769 | 5/1953 | Walker . |
| 3,390,239 | 6/1968 | Miller . |
| 3,534,226 | 10/1970 | Lian . |
| 3,538,277 | 11/1970 | Phillips . |
| 3,611,031 | 10/1971 | Lutz . |
| 3,641,358 | 2/1972 | Lian et al. . |
| 3,651,374 | 3/1972 | Faust . |
| 3,660,723 | 5/1972 | Lutz et al. . |
| 3,670,176 | 6/1972 | Faust . |
| 3,725,742 | 4/1973 | Pollard . |
| 3,737,724 | 6/1973 | Salge et al. . |
| 3,777,178 | 12/1973 | Gratzmuller . |
| 3,982,158 | 9/1976 | Knauer . |
| 4,300,181 | 11/1981 | Premerlani . |
| 4,356,525 | 10/1982 | Kornrumpf et al. . |
| 4,390,763 | 6/1983 | Hruda . |
| 4,392,171 | 7/1983 | Kornrumpf . |
| 4,459,629 | 7/1984 | Titus . |
| 4,463,400 | 7/1984 | Paice et al. ................................. 361/5 |
| 4,544,978 | 10/1985 | Podobinski . |
| 4,550,356 | 10/1985 | Takahashi . |
| 5,029,039 | 7/1991 | Yeh . |
| 5,119,261 | 6/1992 | Sonntagbauer . |
| 5,452,170 | 9/1995 | Ohde et al. . |
| 5,930,130 | 7/1999 | Katyl et al. .............................. 363/53 |

*Primary Examiner*—Matthew Nguyen
*Attorney, Agent, or Firm*—Baker & Botts, LLP

[57] ABSTRACT

In the direct current circuit interruption arrangements disclosed in the specification, a solid state circuit interrupter interrupts the connection in a circuit path between a power source and a load. The stored energy in the circuit is dissipated in a resistive commutation circuit by using controllable power semiconductors such as Insulated Gate Bipolar Transistors to increase resistance between the terminals of the circuit interruption arrangement. An in-line power semiconductor switch acts as the circuit disconnecting device and is shunted by a resistive commutation circuit consisting of a plurality of solid state commutation switches and resistors in various configurations which act to dissipate the energy. In one embodiment the solid state switches in the commutation circuit are connected to a common circuit interrupter terminal and to a resistor through a series of taps on the resistor and the resistor is connected to the other circuit interrupter terminal. In another embodiment, the commutation circuit consists of parallel branches each having a solid state switch in series with a resistor and each branch is shunted across the circuit interrupter. In a further embodiment, the circuit path between the power source and the load consists of a plurality of parallel cables and each cable has an in-line solid state switch with a shunted resistive commutation circuit. In each of the embodiments the in-line solid state switches are opened and the solid state commutation switches are closed simultaneously, introducing resistance into the circuit path. The commutation switches are then sequentially opened to further increase the circuit resistance and complete the circuit interruption without causing electric potentials to exceed the device ratings for the circuit interrupter.

31 Claims, 9 Drawing Sheets

6,075,684

METHOD AND ARRANGEMENT FOR DIRECT CURRENT CIRCUIT INTERRUPTION

BACKGROUND OF THE INVENTION

This invention relates to methods and arrangements for the interruption of current in direct current (DC) circuits. This invention may also provide advantages for alternating current circuits as well.

The interruption of a DC circuit containing inductance requires the inductive energy stored in the circuit to be dissipated by or stored within the circuit breaker. Many circuit breaker designs dissipate the energy stored in the circuit upon circuit interruption by increasing the circuit resistance through various techniques during interruption. As the resistance is increased, the system current is decreased until it reaches zero and the interruption is complete.

Related prior art utilizes conventional mechanical contacts in the circuit path as the circuit interruption devices and provides mechanical or electronic switches (i.e., liquid metal cathode switch tubes, crossed field switch tubes, and the like) as commutation switches to successively introduce increased resistance to absorb the circuit energy subsequent to opening a circuit interruption device. The Lian Patent No. Re 27,557 discloses a mechanical circuit interrupter shunted by a commutation circuit of resistors and switches which are normally closed. Upon circuit interruption, the in-line mechanical contacts are opened to divert current into the commutation circuit, and subsequently, the commutation switches are successively opened to increase shunt resistance so that, when the last switch is opened, the remaining circuit energy can be absorbed in a surge suppressing resistance-capacitor circuit. This and other related prior art such as the Lutz et al. U.S. Pat. No. 3,660,723; the Lian et al. U.S. Pat. No. 3,641,358; the K. T. Lian U.S. Pat. No. 3,534,226; the Lutz U.S. Pat. No. 3,611,031; and the like are suited for high voltage DC power transmission. However, such arrangements incur the shortcomings of in-line mechanical switches such as slow interruption time, shock sensitivity, arcing, contact burning, and noise due to the mechanical nature of the switching devices.

SUMMARY OF THE INVENTION

Accordingly, it is an object of the present invention to provide a method and arrangement for direct current (DC) circuit interruption suitable for high power DC distribution systems to overcome the disadvantages of prior art.

Another object of the invention is to provide a method and arrangement for DC circuit interruption which is modular with respect to parallel cables in a system and which can be easily scaled for different current and power capacities.

Another object of the invention is to provide a method and arrangement for DC circuit interruption which reduces circuit interruption time compared to conventional techniques thereby limiting the amount of let-through energy and lessening the potential for damage to equipment and injury to personnel.

Another object of the invention is to provide a method and arrangement for DC circuit interruption which reduces circuit interruption time compared to conventional techniques, thereby limiting the amount of energy that must be dissipated, thus enabling circuit interrupters to be smaller, weigh less, and cost less.

Another object of the invention is to provide a method and arrangement for DC circuit interruption which reduces circuit interruption time compared to conventional techniques, thereby limiting the amount of let-through energy to enable the reduction of requirements on other system components in an electric power distribution system.

These and other objects of the invention are attained by providing an in-line solid state switch for diverting the current in the circuit into a shunt commutation circuit containing a plurality of resistors and solid state switches which open sequentially to increase the resistance in the circuit after the in-line solid state switch has been opened. In one preferred embodiment of the invention for use in high current circuits, a power circuit comprises a plurality of parallel cables wherein each parallel cable is provided with an in-line solid state switch and a shunt commutation circuit. In one condition the in-line switches provide a closed connection for current passing through their respective cables, and in another condition the switches divert current into their shunt commutation circuits upon interruption of the power circuit. When the power circuit has been interrupted, the cable commutation circuits, which comprise further solid state switches in series with resistors, are turned off sequentially to introduce increasing resistance into the circuit until the last commutation circuit is turned off and the circuit interruption is complete.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

In accordance with the invention one or more circuit disconnecting devices are provided, each having an energy dissipation arrangement to prevent inductive energy in the source or load side of the circuit from generating harmful electric potentials when the circuit is being connected or disconnected. Various embodiments of the invention can utilize any controllable solid-state switching device with turn-on and turn-off capability (such as an Insulated Gate Bi-polar Transistor (IGBT), Metal Oxide Semiconductor Field Effect Transistor (MOSFET), Gate Turn-Off (GTO), MOS Controlled Thyristor (MCT), or the like) as the circuit disconnecting device and similar switching devices in conjunction with resistors as the energy dissipation arrangement. The energy dissipation arrangement is controlled during circuit interruption such that the solid state switches are sequentially turned off to increase the resistance in the circuit path in a rapid manner without causing harmful electric potentials. Throughout the remainder of this description, any controllable solid-state switching device will be referred to as a "switch".

Figure 1:
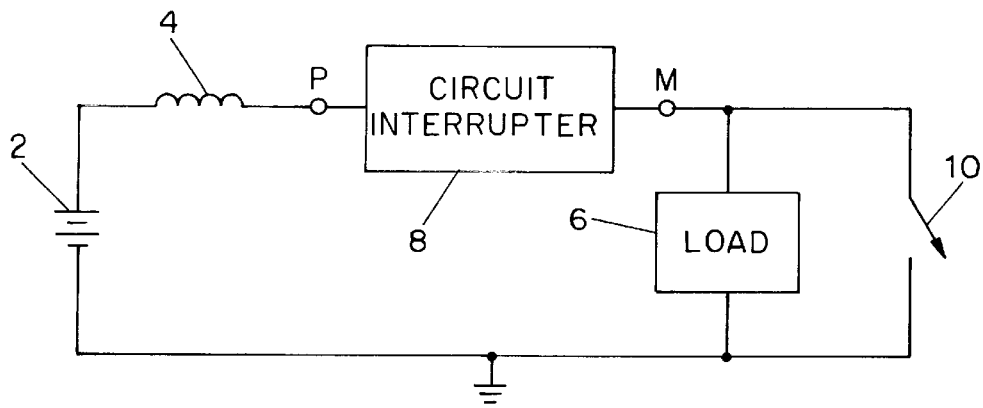
FIG. 1 is a simplified schematic circuit diagram illustrating an electric power distribution system including a direct current circuit interruption arrangement in accordance with the invention.

FIG. 1 is a simplified schematic circuit diagram illustrating a DC electric power distribution system including a DC voltage source 2 connected in series with a lumped system inductance 4 and a load 6. Also in the circuit path is a circuit interruption arrangement 8 according to the present invention having a line terminal P and a load terminal M to interrupt a short circuit represented by a switch 10.

Figure 2:
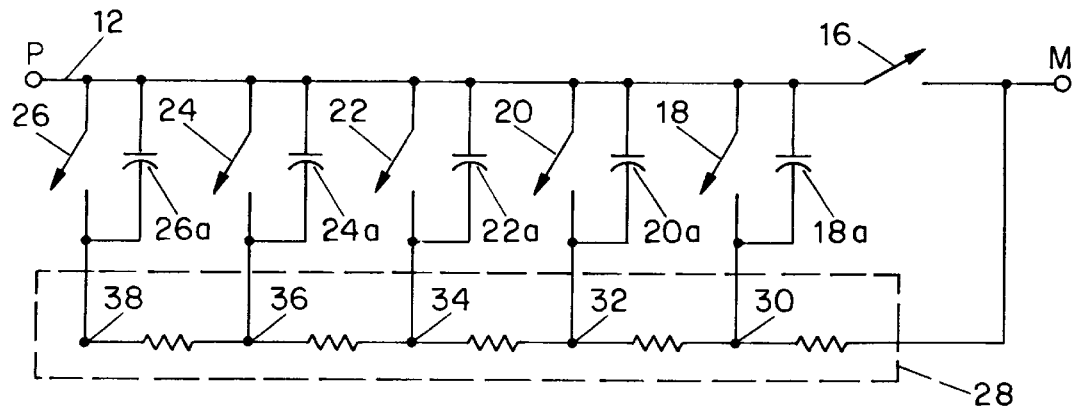
FIG. 2 is a schematic circuit diagram illustrating a representative embodiment of a direct current circuit interruption arrangement in accordance with the invention.

In the representative embodiment of the invention illustrated in FIG. 2, a conductor 12 extending between the line terminal P and the load terminal M contains an in-line switch 16 for disconnecting the conductor 12 between terminals P and M. Five commutation switches 18, 20, 22, 24, and 26 are connected between the line terminal P and a resistor 28 having multiple taps 30, 32, 34, 36, and 38, and the resistor 28 is connected across the in-line switch 16 to the terminal M. The taps 30–38 can be arranged to provide the same or different values of resistance between each pair of taps. Each of the commutation switches 18–26 has a corresponding parallel-connected snubber capacitor 18a–26a. If desired, this embodiment may be provided with any number of switches, capacitors, and resistors within the commutation circuit.

When the circuit interruption arrangement is closed to provide a current path between a power source and the load, the in-line switch 16 is closed and the commutation switches 18–26 are open. In order to interrupt the conductor 12 under a fault condition or otherwise without causing damaging electric potentials, the in-line switch 16 is opened while the commutation switches 18–26 are closed simultaneously with the opening of the in-line switch 16, thus introducing a resistance into the circuit which is essentially equal to the resistance between the terminal M and tap 30 of the resistor 28. This value of the resistance must be chosen with respect to the interrupting conditions to avoid causing an electric potential exceeding the switch device ratings. The amount of resistance between the power source and load is then successively increased by opening the commutation switches in sequential order from the switch 18 to the switch 26. As the resistance is increased, the system current is correspondingly decreased until the interruption is complete when the last switch 26 is opened. The time delays between successive openings of the commutation switches 18–26 must also be selected to avoid causing an electric potential exceeding the switch device ratings.

When the circuit interruption arrangement is to be closed, the in-line switch 16 is re-closed. Alternatively, the circuit interruption arrangement can be closed as to avoid causing a harmful electric potential by closing the commutation switches in sequential order from switch 26 to the switch 18, thus successively decreasing the circuit resistance. Subsequently, the in-line switch 16 can be closed and the commutation switches can be reopened in readiness for the next circuit interruption. This method of a "soft" circuit interrupter reclose may also be used to determine if a fault is still present in the system, thereby stopping the re-close process and initiating the opening process to prevent the in-line switch from being closed into a short circuit.

Figure 3:
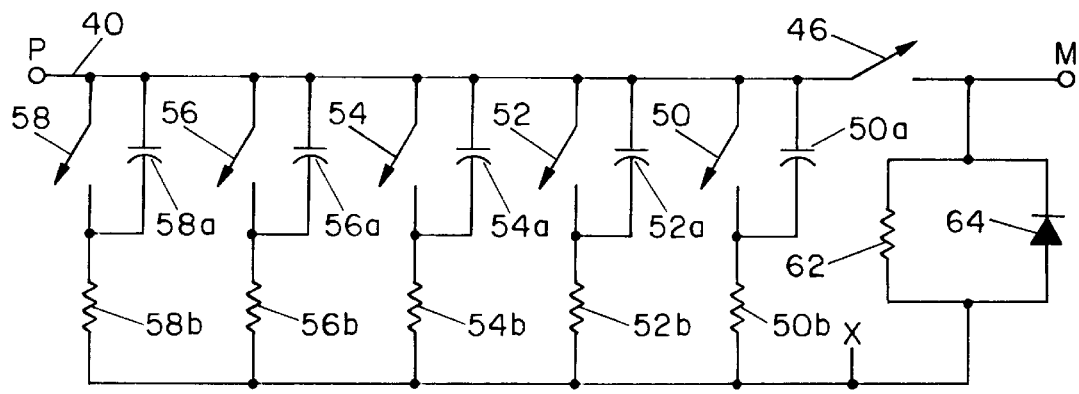
FIG. 3 is a schematic circuit diagram illustrating a further representative embodiment of a direct current circuit interruption arrangement in accordance with the invention.

Instead of using a series resistive commutation circuit of the type illustrated in FIG. 2, another embodiment of the invention having a parallel resistive commutation circuit of the type shown in FIG. 3 may be used. In this embodiment, a conductor 40 extending between the line terminal P and the load terminal M contains an in-line switch 46 for disconnecting the conductor 40 between the terminals P and M. Five commutation switches 50, 52, 54, 56, and 58 are connected in series respectively with five resistors 50b, 52b, 54b, 56b, and 58b between the line terminal P and a node X. The resistors 50b–58b can have the same or different values of resistance. Each of the commutation switches 50–58 has a corresponding parallel-connected snubber capacitor 50a–58a. A snubber circuit consisting of a diode 64 and a parallel resistor 62 is connected between the node X and the load terminal M. The diode 64 prevents post circuit interruption oscillations which may be caused by the switch capacitors 50a thru 58a. The resistor 62 allows the voltage across the capacitors and switches to return to the system voltage after an interruption instead of remaining at the existing voltage during interruption of the circuit. If desired, this embodiment may be provided with any number of switches, capacitors, and resistors within the commutation circuit.

The operation of the in-line switch 46 and the commutation switches 50–58 for opening and closing of this circuit interruption embodiment is the same as for the series resistive commutation circuit embodiment described above with respect to FIG. 2 with the exception that the order of commutation switch opening and closing can be arbitrary if the resistors 50b–58b have the same resistance value.

Figure 12:
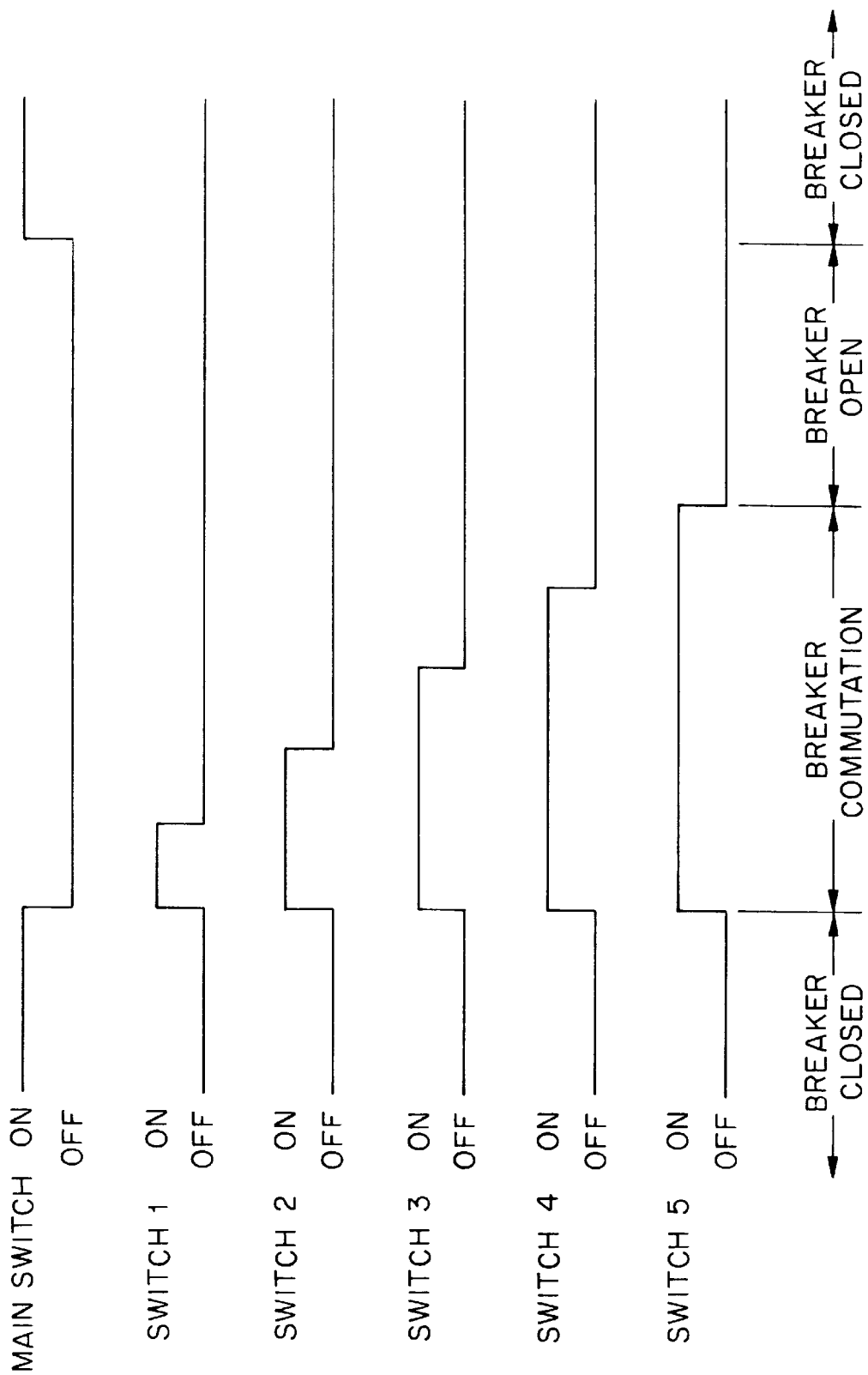
FIG. 12 is a timing diagram showing the changes in switch states with time for the embodiments of FIGS. 2 and 3.

For the circuit interruption arrangements shown in FIGS. 2 and 3, the commutation circuit parameters i.e., the number of components, the resistance values, the capacitance values, and the delay time between sequential operation of successive switches can be designed to achieve a minimum interruption time for a given current without exceeding the voltage and current ratings of the switches. Although the operation of the circuit interruption arrangements of the type shown in FIGS. 2 and 3 is essentially the same, the voltage and current characteristics on the commutation switches during interruption are different. FIG. 12 illustrates the conditions of the in-line switch and the commutation switches during circuit interruption for the series and parallel resistive commutation circuit arrangements of the type shown in FIGS. 2 and 3.

If desired, instead of being connected directly across the in-line switch, the commutation circuit may be connected across the positive and negative circuit conductors on either the source side or the load side of the in-line switch or on both sides, depending on where the system inductance is located. Furthermore, a passive voltage clamping device such as a metal oxide varistor, arc gap, avalanche suppressor or the like can be connected across the entire circuit interruption arrangement or across each switch to further protect the switch components of the embodiments against damaging electric potentials during system anomalies.

Figure 4:
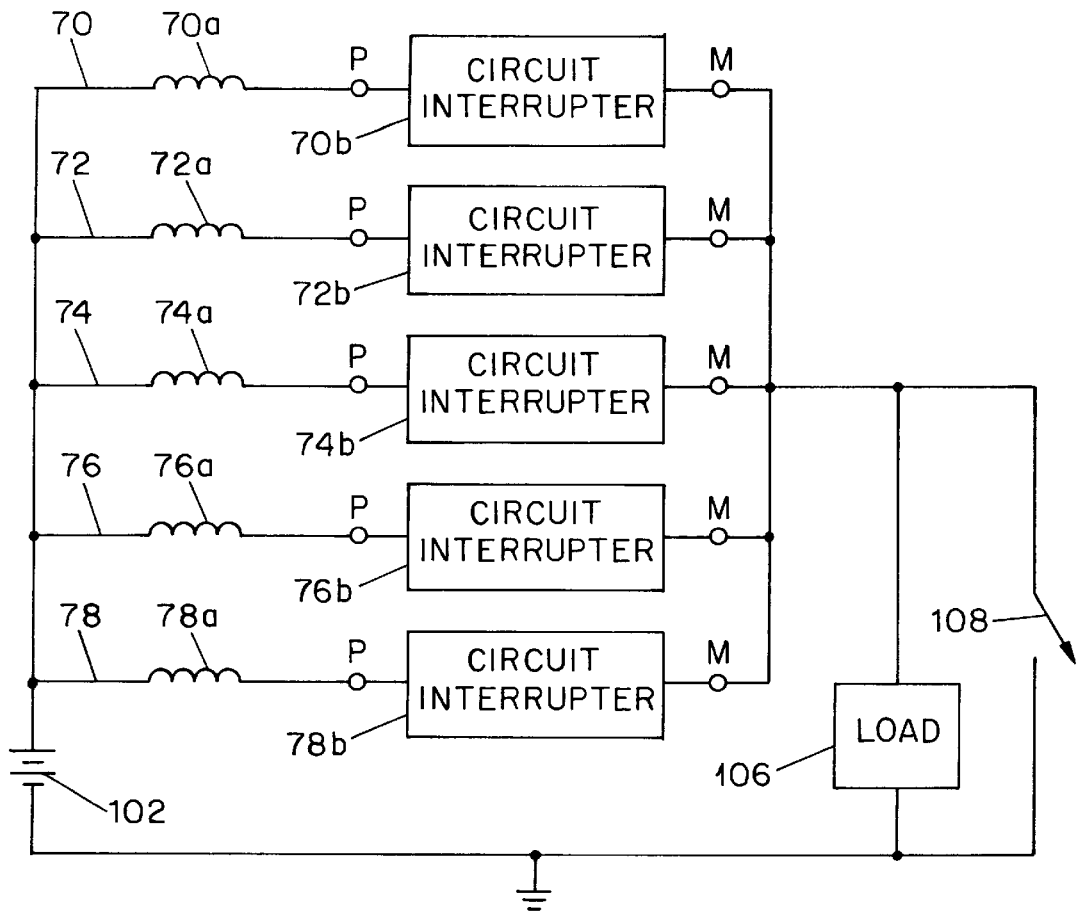
FIG. 4 is a simplified schematic circuit diagram illustrating an electric power distribution system with multiple conductors including the direct current circuit interruption arrangement in accordance with the invention.

The circuit interruption arrangements shown in FIGS. 2 and 3 are subject to the limitations imposed by the ratings of available solid state switching devices. The voltage across the switches must be kept below the rated blocking voltage of the chosen switches thus limiting the system voltage, and the current in the circuit must remain less than the rated current of a single switching device due to the in-line switch which normally conducts all of the system current. This limitation of current, however, can be overcome by providing a circuit interruption arrangement utilizing multiple parallel cables to share system current as is typical in high power electric distribution systems. In this arrangement, each parallel cable includes an identical circuit interrupter thus providing protection for the entire system. FIG. 4 is a simplified schematic circuit diagram illustrating a DC electric power distribution system with multiple parallel cables 70, 72, 74, 76, and 78 each containing a corresponding inductance 70a–78a in series with a circuit interrupter 70b–78b with terminals P and M. The circuit employs a DC voltage source 102 supplying a load 106 via parallel cables 70 thru 78. The circuit interrupters 70b–78b according to the present invention with the terminals P and M in the parallel cables 70 thru 78 interrupt a short circuit represented by the switch 108.

The circuit interrupters 70b–78b in FIG. 4 can be of the type described in either of the previous embodiments of FIGS. 2 and 3. This circuit interruption arrangement results in a modular design because a circuit interrupter can be designed to match the current rating of a selected cable and, in order to increase or decrease continuous and interrupted current levels in an electric distribution system, identical cables and corresponding circuit interrupters can be added to or removed from the system. This circuit interruption arrangement also has the advantage of using only the minimum amount of energy dissipation capacity required for circuit interruption by tailoring the circuit interruption arrangement to the system requirements. This ability to tailor the circuit interruption arrangement on a cable basis eliminates the excess size and weight associated with using circuit breakers with a standard rating in applications which require less capacity than the rating of the circuit breakers. The circuit interrupters in FIG. 4 can be operated as described previously, independently of each other based only on the condition of the respective cable, or the circuit interrupters can be coordinated to operate together based on the condition of any one or a combination of the parallel cables.

Figure 5:
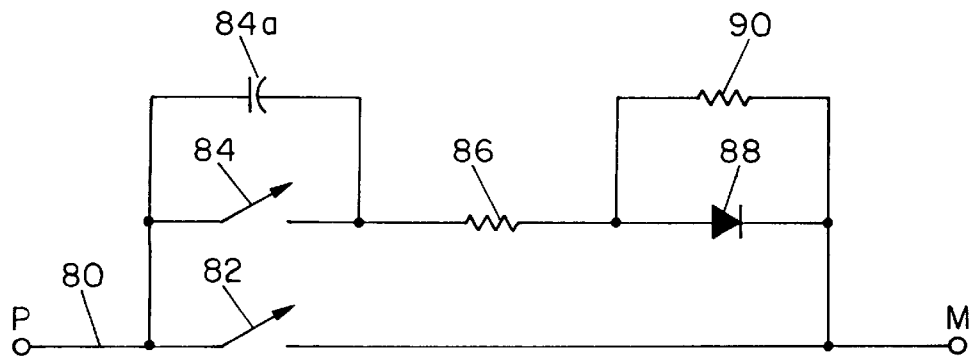
FIG. 5 is a schematic circuit diagram illustrating another representative embodiment of a direct current circuit interruption arrangement in accordance with the invention.

The circuit illustrated in FIG. 4 may alternatively employ the circuit interruption arrangement shown in FIG. 5 within each of the circuit interrupters with terminals P and M. In the representative embodiment of the invention illustrated in FIG. 5, a conductor 80 extending between a line terminal P and a load terminal M contains an in-line switch 82 for disconnecting the conductor 80 between the terminals P and M. A commutation switch 84 with a parallel snubber capacitor 84a is connected between the line terminal P and a resistor 86 and a snubber circuit consisting of a diode 88 and a parallel resistor 90 is connected between the resistor 86 and the load terminal M. The diode 88 prevents oscillations which may occur after circuit interruption. The resistor 90 allows the voltage across the capacitor and switch to return to the system voltage after an interruption instead of remaining at the voltage during interruption of the circuit. Each of the cables 70–78 in FIG. 4 is provided with an identical circuit interrupter as depicted in FIG. 5, each having the same resistor and capacitor values.

The operation of a circuit interruption arrangement using multiple circuit interrupter embodiments as shown in FIG. 5 within an electric distribution system comprised of multiple parallel cables represented by FIG. 4 is such that, when the circuit interruption arrangement is closed, providing a current path between the power source and the load, each in-line switch 82 is closed and each commutation switch 84 is open. In order to interrupt current in the system under a fault condition or otherwise without causing damaging electric potentials, each in-line switch 82 in the cables 70–78 is opened while each commutation switch 84 is closed simultaneously with the opening of the in-line switches 82, thus introducing resistance into the circuit essentially equal to the resistance 86 divided by the number of parallel cables (five in this case). This value of resistance must be chosen with respect to the interrupting conditions to avoid causing an electric potential exceeding the switch device ratings. The amount of resistance between the power source and the load is then successively increased by sequentially opening each commutation switch 84. As the resistance is increased, the system current is correspondingly decreased until the interruption is completed with the opening of the last commutation switch. The time delays between opening of successive commutation switches 84 must also be selected to avoid causing an electric potential exceeding the switch device ratings.

When the circuit interruption arrangement is to be closed, each in-line switch 82 in the parallel cables 70–78 is simultaneously re-closed. Alternatively, the circuit interruption arrangement can be closed as to avoid causing a harmful electric potential by sequentially closing the commutation switches 84, thus successively decreasing the circuit resistance. Subsequently, each in-line switch 82 can be simultaneously re-closed and the commutation switches can be re-opened in readiness for the next circuit interruption. This circuit interruption arrangement provides a commutation circuit which is integrated with the parallel cables in the system. This integrated commutation circuit arrangement permits a reduction in the total number of components required in comparison with arrangements using a plurality of the series or parallel resistive commutation circuit arrangements of the type shown in FIGS. 2 and 3. An optimal circuit interruption arrangement and method may include a combination of the integrated commutation circuit method with the series or parallel resistive commutation circuit arrangements and methods.

In an electric power distribution system containing a plurality of loads fed from a common bus, a single commutation circuit of the type shown in FIG. 2 or FIG. 3 may be implemented to interrupt any of the load circuits. This circuit interruption arrangement employs an in-line switch in each conductor supplying current to a load, and further switches connected between the load side of each in-line switch and the load side of a single commutation circuit. The line side of the commutation circuit is then connected to the common bus, thereby connecting the commutation circuit in parallel with each in-line switch in the load circuit conductors. The operation of this arrangement is similar to that of the arrangement described above except that, when a load circuit is to be interrupted, only the in-line switch in that load circuit conductor and the switch connecting that conductor to the commutation circuit are operated in conjunction with the commutation switches.

The snubber circuits consisting of a parallel combination of a diode and a resistor shown in the circuit interruption arrangements of FIGS. 3 and 5 could be eliminated if ringing after the circuit interruption is not of concern, or if the snubber capacitors across the commutation switches are sized to overdamp the circuit. Additionally, a snubber circuit could be added to the circuit interruption arrangement shown in FIG. 2.

The voltage limitation imposed by available solid state switches could also be overcome by using multiple switches in series within each circuit interrupter, or by using a series combination of circuit interrupters. The use of series switching devices would yield a voltage scaleability to permit higher system and interrupting voltages. Another configuration of the circuit interruption arrangements of the invention which can permit current flow in the reverse direction includes an anti-parallel diode across the in-line switches. To accommodate bidirectional current flow and bidirectional circuit interruption, the circuit interruption arrangements are placed in diode bridge circuits, or the switches are made bidirectional through various techniques such as an anti-parallel configuration of unidirectional switches, or a combination of these methods may be employed.

If leakage currents from the solid state switches when the circuit is open are unacceptable, a set of mechanical contacts may be used in the circuit interruption arrangements to provide complete electrical isolation without suffering from any performance degradation. If necessary, the mechanical contacts may be placed in series with the in-line switch and commutation circuit and may be controlled either manually or by the circuit interrupter control system. The mechanical contacts are rated to carry full current and are opened after circuit interruption and closed before the circuit interrupter is re-closed. The time delay for opening and closing the mechanical contacts is not critical for circuit interruption and connection. Because the contacts are opened only under leakage current conditions in the milliampere range, they can be smaller and require less maintenance than arcing contacts. For electric distribution systems with multiple parallel cables, a single set of contacts may be used at the distribution bus where cables are combined, or a set of contacts may be located in each cable to retain the modularity aspects of these circuit interruption arrangements.

Figure 6:
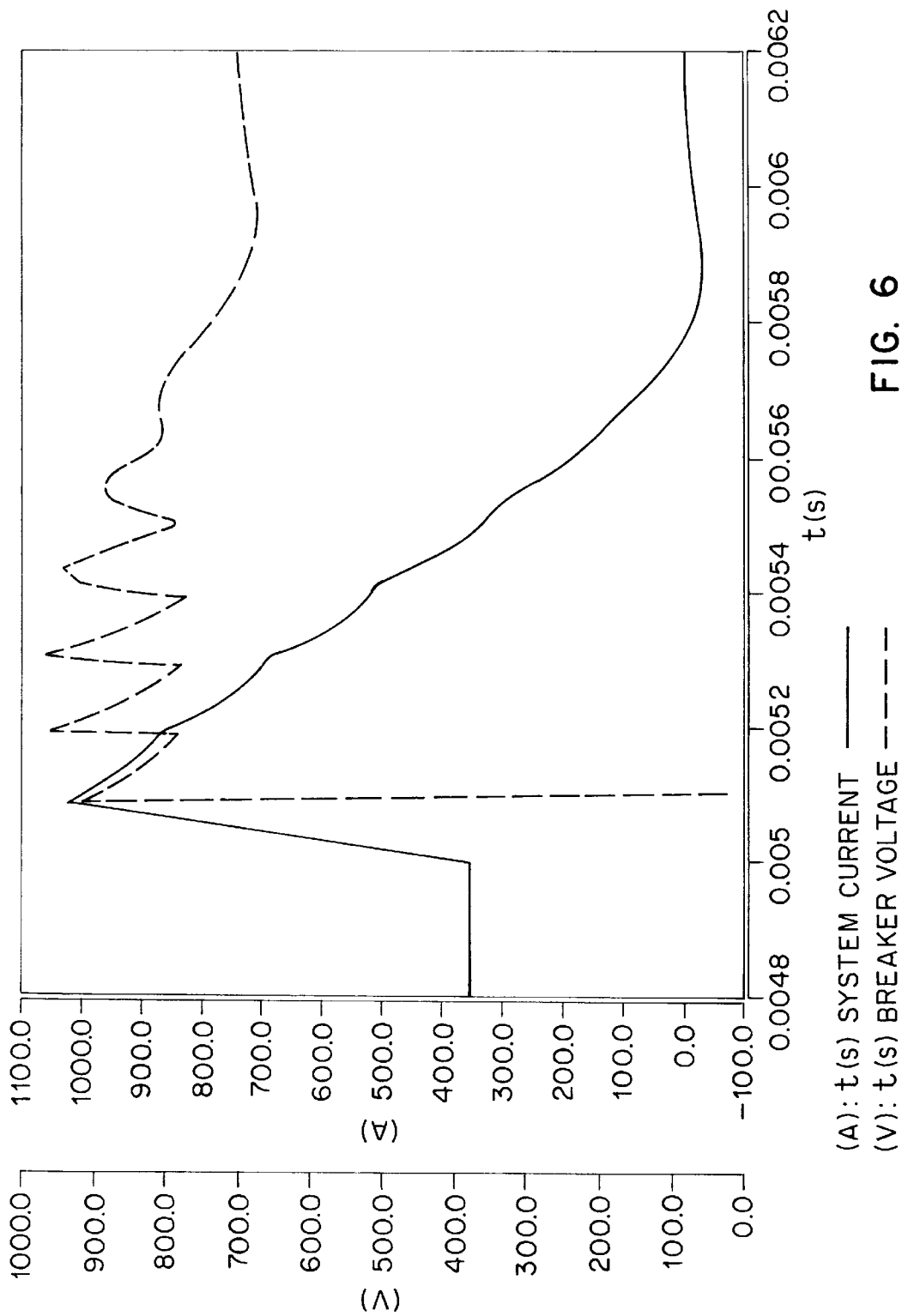
FIG. 6 is a graphical illustration showing the changes in system current and the circuit interrupter voltage with time during a short circuit interruption using the arrangement shown in FIG. 2.
Figure 7:
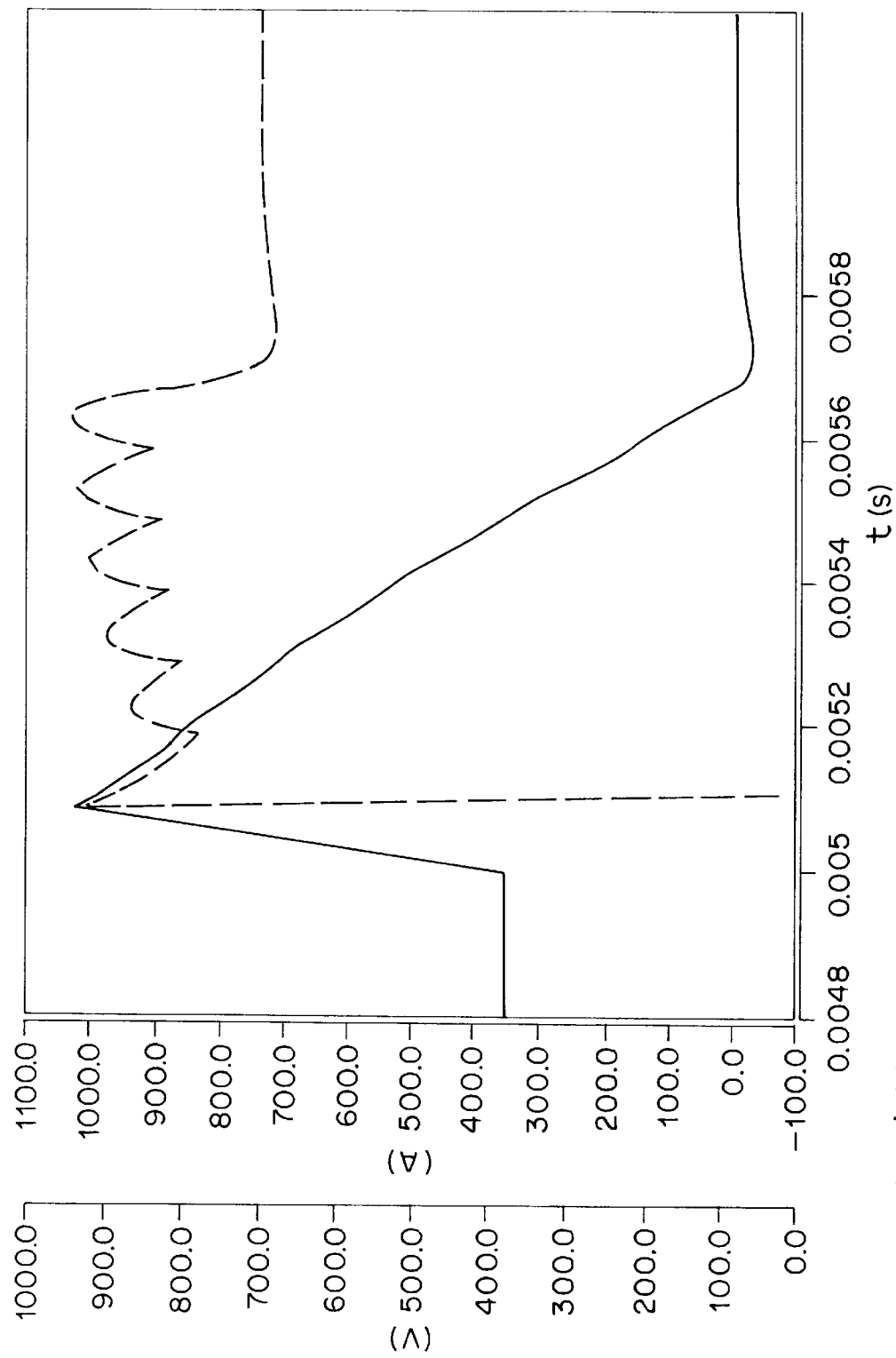
FIG. 7 is a graphical illustration showing the changes in system current and the circuit interrupter voltage with time during a short circuit interruption using the arrangement shown in FIG. 3.

FIG. 6 shows the change in system current (A) and circuit interrupter voltage (V) with time for a series resistive commutation circuit of the type shown in FIG. 2 during a simulated short circuit interruption of an electric power distribution system as shown in FIG. 1. In this case the circuit interrupter with five commutation switches arranged as shown in FIG. 2 interrupted a 1,000 ampere short circuit current in less than one millisecond. In the illustrated example, the short circuit occurred at five milliseconds and the interruption was initiated when the current reached 1,000 amperes. The system had an inductance of 100 microhenries and the system voltage was 700 volts. The voltage across the circuit interrupter during commutation was maintained at approximately 900 volts which is a value below the ratings of available solid state switching devices. As shown in FIG. 6, the system current was driven to zero at a near constant rate until the interruption was complete. FIG. 7 shows a similar operation for a parallel resistive commutation circuit of the type shown in FIG. 3 during a simulated short circuit interruption of an electric power distribution system as shown in FIG. 1 with the same system parameters as described above.

Figure 8:
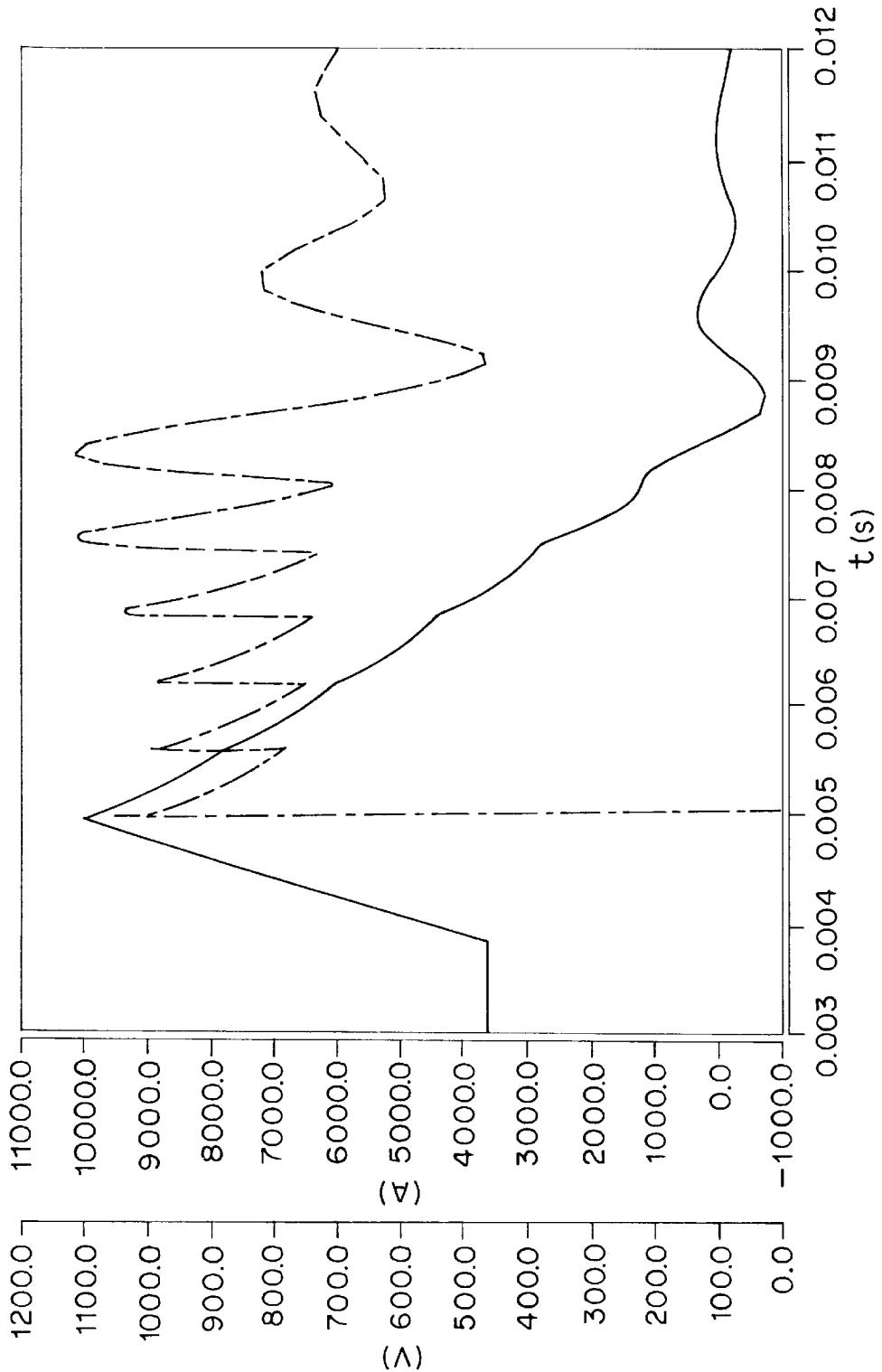
FIG. 8 is a graphical illustration showing the changes in system current and the circuit interrupter voltage with time during a short circuit interruption using a plurality of the arrangements shown in FIG. 2.
Figure 9:
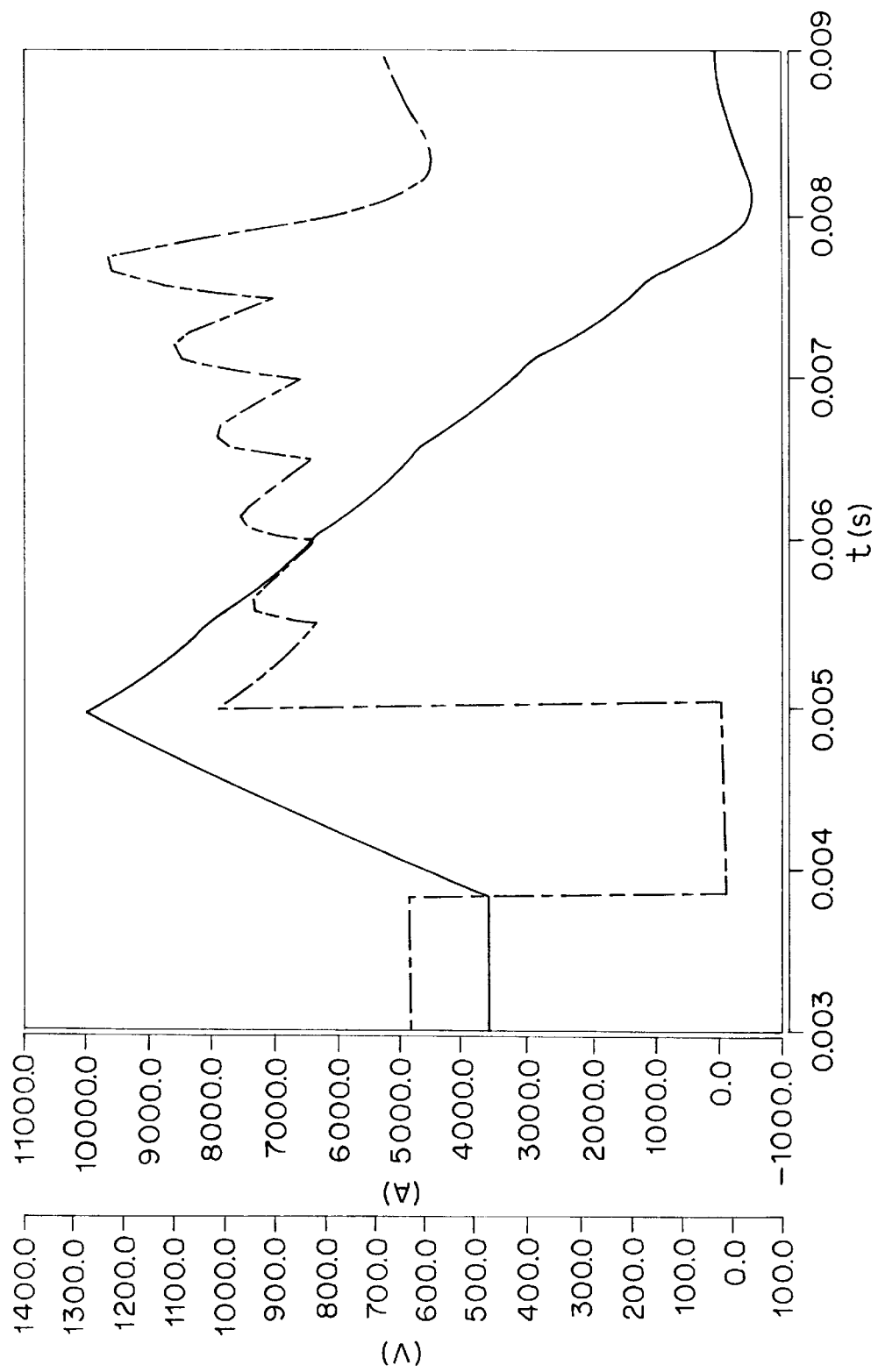
FIG. 9 is a graphical illustration showing the changes in system current and the circuit interrupter voltage with time during a short circuit interruption using a plurality of the arrangements shown in FIG. 3.

FIGS. 8 and 9 illustrate the changes in system current (A) and circuit interrupter voltage (V) with time for a simulated short circuit interruption of an electric power distribution system of the type shown in FIG. 4 except that the system employed ten parallel cables and circuit interrupters. Circuit interruption was triggered when the system current reached 10,000 amperes. FIG. 8 shows the result of using ten series resistive commutation circuit interrupters of the type shown in FIG. 2, and FIG. 9 shows the result of using ten parallel resistive commutation circuit interrupters of the type shown in FIG. 3. The longer interruption times of FIG. 8 and 9 compared to those of FIG. 6 and 7 are the result of the difference in maximum short circuit current in the conductors.

Figure 10:
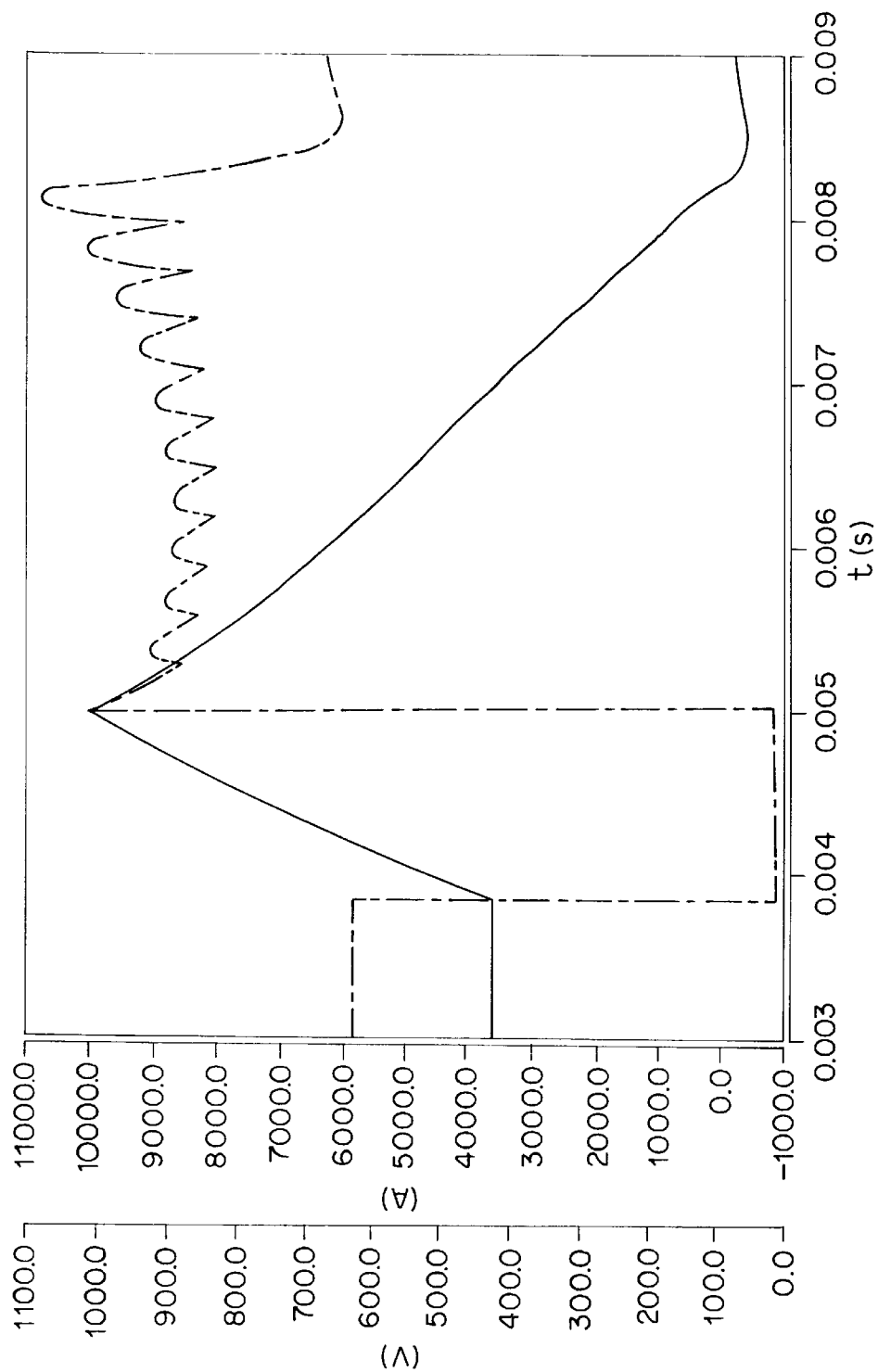
FIG. 10 is a graphical illustration showing the changes in system current and the circuit interrupter voltage with time during a short circuit interruption using the arrangement shown in FIG. 5.
Figure 11:
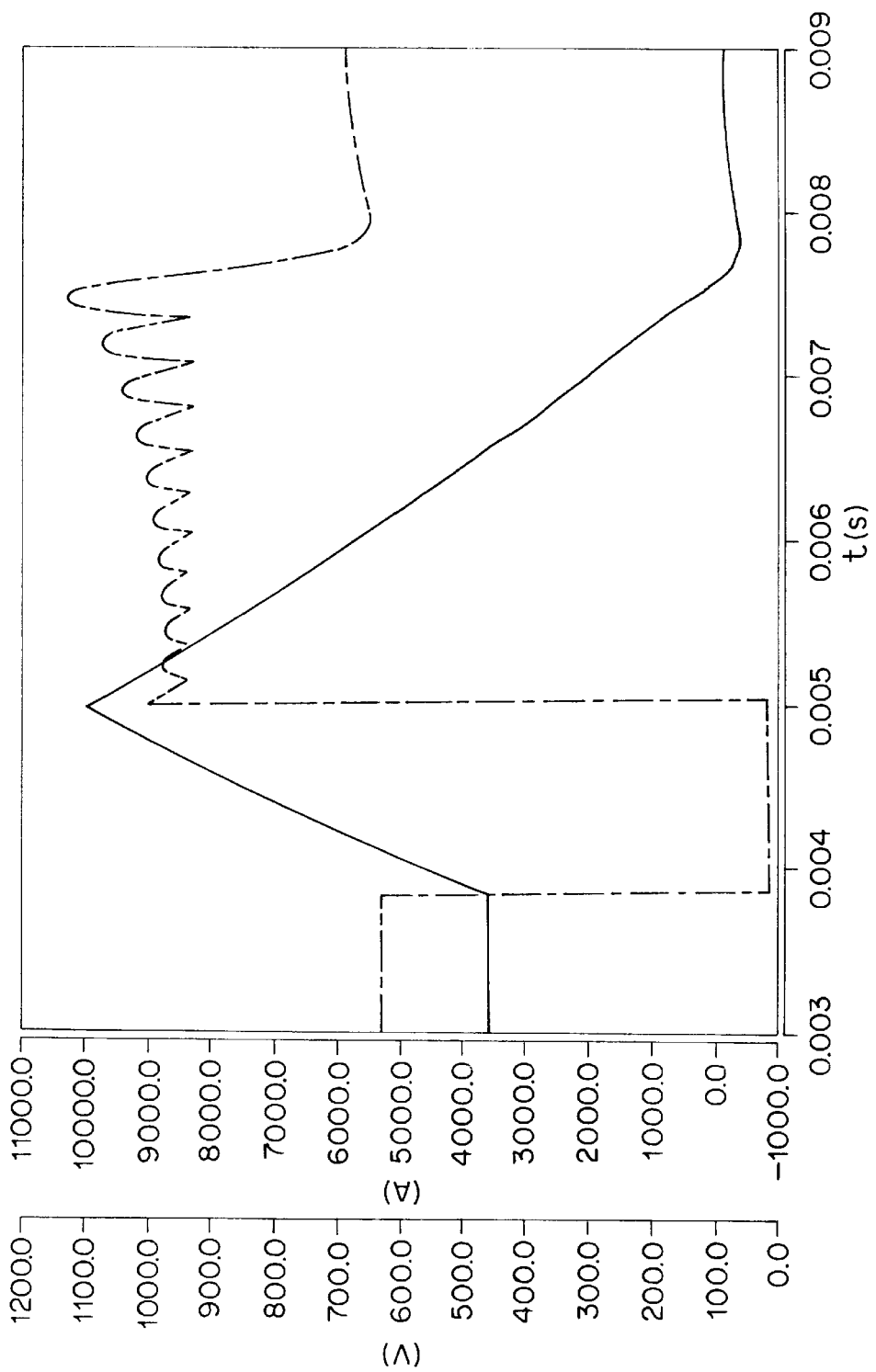
FIG. 11 is a graphical illustration showing the changes in system current and the circuit interrupter voltage with time during a short circuit interruption using the arrangement shown in FIG. 5 with a modified commutation method.

FIG. 10 illustrates the changes in system current (A) and circuit interrupter voltage (V) with time for a simulated short circuit interruption of an electric power distribution system as shown in FIG. 4 except that the system employed ten parallel cables, each containing a circuit interrupter of the type shown in FIG. 5 to yield a commutation circuit integrated with the system's cables. Circuit interruption was triggered when the system current reached 10,000 amperes. This circuit interruption arrangement and methodology produced interruption times similar to those of FIG. 8 and FIG. 9. The dip in circuit interrupter voltage during commutation indicates that the interruption could be completed more rapidly if the delay time between successive commutation switch openings was not fixed. FIG. 11 illustrates the changes in system current (A) and circuit interrupter voltage (V) with time for the same system simulated in FIG. 10 except that the integrated commutation circuit was switched based upon the value of the voltage across the circuit interrupters rather than based on a fixed delay between switch turn-off as depicted in FIG. 10. Using this methodology the time required to complete the circuit interruption was reduced by 0.65 milliseconds.

With the circuit interruption arrangements of the present invention, fast acting DC circuit interruption can be achieved by turning the in-line switches off and the commutation switches on simultaneously, and then sequentially turning the commutation switches off, thereby producing interruption times which are an order of magnitude faster than with conventional mechanical circuit breakers. Based on simulations, it has been shown that interruption times between 0.5 and 3 milliseconds may be achieved depending on system parameters. Ultimately, interruption time will be determined by the system parameters (system inductance and short circuit current) and the selection of circuit interrupter components. For example, selection of solid state switching devices with a higher voltage rating allows the voltage across the switches during circuit interruption to be increased, thereby producing faster circuit interruption times. Interrupting fault conditions sooner will limit the fault current magnitude, consequently reducing the amount of energy stored in the system. The stored energy is usually represented only as inductive energy which is $\frac{1}{2} L_{SYSTEM} I^2_{FAULT}$.

Another advantage of the invention is the use of resistors to dissipate the stored energy rather than requiring large, expensive capacitors for energy storage during circuit interruption. Furthermore, the use of solid state switches in conjunction with resistors provides cost, size, weight, shock, and maintenance improvements in comparison with conventional mechanical air circuit breakers by avoiding the use of mechanical contacts for interruption and arc chutes for energy dissipation. The invention also does not require the use of current-limiting fuses to coordinate interruptions as is often necessary for mechanical or other circuit breakers. Any reduction in efficiency resulting from the use of solid state switches in the conduction path is small and may be negligible when compared to overall losses in the system. By sensing and interrupting faults very quickly in comparison with conventional electromechanical circuit breakers, the total energy required to be dissipated or stored in the circuit interrupter is reduced as is the total energy passed through to other circuit components. This permits the circuit interrupters to be made smaller, weigh less, and cost less, and allows short circuit requirements to be less restrictive for other system components.

Although the invention has been described herein with reference to specific embodiments, many modifications and variations therein will readily occur to those skilled in the art. Accordingly, all such variations and modifications are included within the intended scope of the invention.

We claim:

1. A circuit interruption arrangement connected in a circuit path between a power source and a load comprising:
   an in-line solid state switch connected in the circuit path to provide continuity between the power source and load when closed and to divert current flow into a shunt commutation circuit when opened, said commutation circuit comprising;
   a plurality of commutation branches connected in parallel across the circuit interruption arrangement wherein each commutation branch comprises a solid state commutation switch, a snubber capacitor across the solid state commutation switch and a resistor in series with the solid state commutation switch and the capacitor.

2. A circuit interruption arrangement according to claim 1 wherein each resistor in the commutation circuit has the same value of resistance.

3. A circuit interruption arrangement according to claim 1 wherein the commutation circuit further comprises a diode and resistor in parallel for suppressing voltage oscillations after circuit interruption, the cathode of the diode being connected to the load side terminal of the circuit interruption arrangement and the anode of the diode being connected to a node which is common to the parallel commutation branches.

4. A circuit interruption arrangement according to claim 1 further comprising a mechanical contactor connected in series with the in-line solid state switch and with the shunt commutation circuit and arranged to be opened to provide complete electrical isolation when the circuit interruption arrangement is in an open state.

5. A circuit interruption arrangement according to claim 1 further comprising a freewheeling diode shunted across the in-line solid state switch, thus providing a circuit interruption arrangement capable of interrupting current in one direction and passing current in the opposite direction.

6. A circuit interruption arrangement according to claim 1 wherein each solid state switch is capable of conducting current in either direction and is capable of current turnoff in either direction, thus providing a bidirectional circuit interruption arrangement.

7. A circuit interruption arrangement according to claim 1 including a bridge rectifier and wherein the circuit interruption arrangement is connected across the terminals of the bridge rectifier, thus providing a bidirectional circuit interruption arrangement.

8. A circuit interruption arrangement connected in a circuit path between a power source and a load comprising:
   an in-line solid state switch connected in the circuit path to provide continuity between the power source and load when closed and to divert current flow into a shunt commutation circuit when opened; and
   a shunt commutation circuit comprising;
   a plurality of solid state commutation switches, a snubber capacitor shunting each solid state commutation switch, one common terminal of each switch and a corresponding snubber capacitor being connected to a common terminal of the circuit interruption arrangement and the other common terminal of each commutation switch and corresponding snubber capacitor being connected to one of a plurality of resistors, the plurality of resistors being connected in series with each other and the series-connected resistors being connected to the other terminal of the circuit interruption arrangement.

9. A circuit interruption arrangement according to claim 8 wherein the plurality of resistors in the commutation circuit comprise a single resistance element with a plurality of taps.

10. A circuit interruption arrangement according to claim 8 further comprising a diode and a resistor connected in parallel for suppressing voltage oscillations after circuit interruption, the cathode of the diode being connected to the load side terminal of the circuit interruption arrangement and the anode of the diode being connected to one end of the series-connected resistors.

11. A circuit interruption arrangement according to claim 8 further comprising a mechanical contactor connected in series with the in-line solid state switch and with the shunt commutation circuit and arranged to be opened to provide complete electrical isolation when the circuit interruption arrangement is in the open state.

12. A circuit interruption arrangement according to claim 8 further comprising a freewheeling diode shunted across the in-line solid state switch, thus providing a circuit interruption arrangement capable of interrupting current in one direction and passing current in the opposite direction.

13. A circuit interruption arrangement according to claim 8 wherein each solid state switch is capable of conducting current in either direction and capable of current turnoff in either direction, thus providing a bidirectional circuit interruption arrangement.

14. A circuit interruption arrangement according to claim 8 including a bridge rectifier and wherein the circuit interruption arrangement is connected across the terminals of the bridge rectifier, thus providing a bidirectional circuit interruption arrangement.

15. A circuit interruption arrangement according to claim 1 or claim 8 further comprising control means responsive to command signals for opening and closing the circuit interruption arrangement so that;
   when an open command is received the in-line solid state switch is opened and the commutation circuit switches are closed simultaneously, and then the commutation switches are opened in a sequential manner; and
   when a close command is received the in-line solid state switch is closed; or
   when a close command is received the commutation switches are closed in a sequential manner, and then the in-line solid state switch is closed and the commutation switches are opened.

16. A circuit interruption arrangement according to claim 15 wherein the time delays between sequential opening or closing of the switches are equal.

17. A circuit interruption arrangement according to claim 15 including sensing means for monitoring circuit voltage or current conditions and wherein the time delays between sequential opening or closing of the switches are controlled by the sensing means.

18. A circuit interruption arrangement comprising a circuit path between a power source and a load including a plurality of parallel conductors wherein each of the conductors includes an interrupting circuit comprising an in-line solid state switch and a shunt commutation circuit with solid state commutation switches.

19. A circuit interruption arrangement according to claim 18 wherein each of the interrupting circuits comprises:

an in-line solid state switch connected in the circuit path to provide continuity between the power source and load when closed and to divert current flow into the shunt commutation circuit when opened; and the shunt commutation circuit comprising a plurality of commutation branches connected in parallel across the in-line solid state switch wherein each commutation branch comprises a solid state commutation switch, a snubber capacitor connected across the solid state commutation switch and a resistor in series with the solid state commutation switch and the capacitor.

20. A circuit interruption arrangement according to claim 18 wherein the plurality of parallel conductors each includes a circuit interruption arrangement comprising an in-line solid state switch connected in the circuit path to provide continuity between the power source and load when closed and to divert current flow into the shunt commutation circuit when opened; and the shunt commutation circuit comprising;

a plurality of solid state commutation switches, a snubber capacitor shunting each solid state commutation switch, one common terminal of each commutation switch and corresponding snubber capacitor being connected to a common terminal of the circuit interruption arrangement and the other common terminal of each commutation switch and corresponding snubber capacitor being connected to one of a plurality of resistors, the plurality of resistors being connected in series with each other and the series-connected resistors being connected to the other terminal of the circuit interruption arrangement.

21. A circuit interruption arrangement comprising a circuit path which includes a plurality of parallel conductors between a power source and a load comprising:

an interrupting circuit in each of the parallel conductors comprising a solid state switch connected to provide continuity between the power source and load when closed and to divert current flow into the shunt commutation circuit when opened, and the shunt commutation circuit comprising:

a solid state commutation switch, a snubber capacitor connected across the commutation switch and a resistor connected in series with the switch and the snubber capacitor.

22. A circuit interruption arrangement according to claim 21 wherein the resistors in the commutation circuits have the same value of resistance.

23. A circuit interruption arrangement according to claim 21 wherein each commutation circuit further comprises a diode and a resistor connected in parallel for suppressing voltage oscillations after circuit interruption, the cathode of the diode being connected to the load side of the circuit interruption arrangement and the anode of the diode being connected in series with the commutation switch and resistor.

24. A circuit interruption arrangement according to claim 21 further comprising a mechanical contactor connected in series with the in-line solid state switch and with the shunt commutation circuit and arranged to be opened to provide complete electrical isolation when the circuit interruption arrangement is in an open state.

25. A circuit interruption arrangement according to claim 21 further comprising a freewheeling diode shunted across the in-line solid state switch in each conductor thus providing a circuit interruption arrangement capable of interrupting current in one direction and passing current in the opposite direction.

26. A circuit interruption arrangement according to claim 21 wherein each solid state switch is capable of conducting current in either direction and is capable of current turnoff in either direction, thus providing a bidirectional circuit interruption arrangement.

27. A circuit interruption arrangement according to claim 21 including a bridge rectifier in each conductor and wherein the interrupting circuit in each conductor is connected across the terminals of the corresponding bridge rectifier, thus providing a bidirectional circuit interruption arrangement.

28. A circuit interruption arrangement according to claim 21 further comprising control means responsive to command signals for opening and closing the circuit interruption arrangement so that;

when an open command is received, the in-line solid state switch in each conductor is opened and the corresponding commutation circuit switches are closed simultaneously and then the commutation switches are opened in a sequential manner; and when a close command is received, the in-line solid state switch in the conductors are closed simultaneously; or when a close command is received, the commutation circuit switches are closed in a sequential manner, and then the in-line solid state switches in the conductors are closed simultaneously and the commutation switches are opened.

29. A circuit interruption arrangement according to claim 28 wherein the time delays between sequential opening or closing of the switches are equal.

30. A circuit interruption arrangement according to claim 28 including sensing means for monitoring circuit voltage or current conditions and wherein the time delays between sequential opening or closing of the switches are controlled by the sensing means.

31. A circuit interruption arrangement for an electric power distribution system which includes a plurality of load circuits fed from a common bus comprising an in-line solid state switch in each load circuit and a single commutation circuit containing solid state commutation switches connected to the common bus for and through corresponding further solid state switches to each of the load circuits for controlling interruption of the circuit path between the bus and each specific load circuit.

* * * * *